United States Patent [19]

Shinjo et al.

[11] Patent Number: 5,432,661
[45] Date of Patent: Jul. 11, 1995

[54] MAGNETORESISTANCE EFFECT ELEMENT

[75] Inventors: Teruya Shinjo, Uji; Yasuhiro Kawawake, Suita; Toshio Takada, deceased, late of Kyoto, Japan, by Komichi Takada, Jun Takada, Kei Takada, legal representatives

[73] Assignee: Seisan Kaihatsu Kagaku Kenkyusho, Kyoto, Japan

[21] Appl. No.: 191,200

[22] Filed: Feb. 3, 1994

[30] Foreign Application Priority Data

Feb. 3, 1993 [JP] Japan .................. 5-016194

[51] Int. Cl.[6] .................................... G11B 5/127
[52] U.S. Cl. .................................... 360/113
[58] Field of Search ........................ 360/113

[56] References Cited

U.S. PATENT DOCUMENTS 4,103,315  7/1978  Hempstead et al. ............ 360/113 X
5,287,238  2/1994  Baumgart et al. ................ 360/113
5,341,261  8/1994  Dieny et al. ....................... 360/113

*Primary Examiner*—John H. Wolff
*Attorney, Agent, or Firm*—Wenderoth, Lind & Ponack

[57] ABSTRACT

A magnetoresistance effect element is provided which comprises a substrate on which a first magnetic layer having a thickness of 0.2 to 5 nm which contains cobalt, a second magnetic layer having a thickness of not larger than 5 nm which contains iron or nickel or an alloy thereof, a third magnetic layer having a thickness of 0.2 to 5 nm which contains cobalt and a nonmagnetic layer having a thickness of 0.5 to 5 nm are laminated in this order at least twice, wherein the thickness of the second magnetic layer is not larger than half of the total thickness of the first and third magnetic layers. The element is useful as a magnetoresistance sensor or head.

5 Claims, 4 Drawing Sheets

MAGNETORESISTANCE EFFECT ELEMENT

BACKGROUND OF THE INVENTION

1. Field of the Invention

The present invention relates to a magnetoresistance effect element for reading the intensity of a magnetic field as a signal generated by a magnetic recording medium and the like.

2. Description of the Related Art

Currently, the a sensitivity of a magnetic sensor and the density of magnetic recording are increasing. With such increase, magnetoresistance effect magnetic sensors (hereinafter referred to as "MR" sensor) and magnetoresistance effect magnetic heads (hereinafter referred to as "MR" head) have been vigorously developed. The MR sensor and head read an external magnetic signal through the resistance change in a reading sensor comprising a magnetic material. Since the relative speed of the MR sensor or head to the magnetic recording medium does not depend on the reproducing output, a high sensitivity is achieved by the MR sensor and a high output is obtained by the MR head even in case of a high density magnetic recording.

However, with a MR sensor which comprises a conventional magnetic substance utilizing anisotropic magnetoresistance effect such as $Ni_{0.8}Fe_{0.2}$, The magnetoresistance ratio $\Delta R/R$ (which will be defined below) is only about 2 to 5%. Thus, a MR element having a larger magnetoresistance ratio is desired.

Recently, it was found that an artificial superlattice layer in which magnetic layers and nonmagnetic layers are alternately laminated such as a Fe/Cr system, induces a large magnetoresistance effect (cf. Phys. Rev. Lett., 61, 2472 (1988)). However, with this artificial superlattice layer, the external magnetic field at which the maximum resistance change is achieved is very large, namely ten or more KOe. Therefore, this artificial superlattice layer as such cannot be practically used.

Following the above artificial superlattice layer, a large magnetoresistance effect has also been found in various other systems. Among them, a Co/Cu artificial superlattice layer induces the magnetoresistance change, namely $\Delta R/R$ of 60% or larger even in a small magnetic field change of about 10 KOe at room temperature (cf. Appl. Phys. Lett., 58, 2712 (1991)).

However, with the Co/Cu artificial superlattice layer, the intensity of the external magnetic field at which the resistance change occurs is too large, and it is difficult to practically use the artificial superlattice as the MR sensor or head.

SUMMARY OF THE INVENTION

An object of the present invention is to provide a magnetoresistance effect element which induces a large resistance change even at a low intensity of the magnetic field.

According to the present invention, there is provided a magnetoresistance effect element comprising a substrate on which a first magnetic layer having a thickness of 0.2 to 5 nm which comprises cobalt, a second magnetic layer having a thickness of not larger than 5 nm which comprises iron or nickel or an alloy thereof, a third magnetic layer having a thickness of 0.2 to 5 nm which comprises cobalt and a nonmagnetic layer having a thickness of 0.5 to 5 nm are laminated in this order at least twice, wherein the thickness of said second magnetic layer is not larger than half of the total thickness of said first and third magnetic layers.

In a preferred embodiment, the nonmagnetic layer comprises at least one metal selected from the group consisting of Ag, Au and Ru.

DETAILED DESCRIPTION OF THE INVENTION

To decrease the external magnetic field change at which the resistance change of the Co/Cu artificial superlattice occurs, it is contemplated to use, as a magnetic layer, a material magnetization of which is more easily inverted than cobalt. But, it is said that a scattering mechanism at an interface between the magnetic layer and the nonmagnetic layer has an important effect on the resistance change in the large MR effect of the artificial superlattice. Accordingly, if a condition of the interface is changed by alloying or formation of a foreign atom layer, the possibility of the decrease of $\Delta R/R$ is high.

In the present invention, Fe, Ni, or FeNi alloy layers are added between Co layers to preserve the interface between Co and the nonmagnetic layers. By the effect of iron or nickel in the intermediate magnetic layer (the second magnetic layer), the magnetization of the artificial superlattice is inverted at a comparatively low intensity of the magnetic field, so that the artificial superlattice exhibits a larger resistance change at a relatively low intensity of the magnetic field.

When the second magnetic layer is introduced, the interfaces between the cobalt layers on both sides (the first and third magnetic layers) and the nonmagnetic layer are maintained. In addition, since an atom size of iron or nickel does not greatly differ from those of Co and Cu, a large lattice strain is not induced. Consequently, the magnetoresistance effect element comprising the artificial superlattice according to the present invention exhibits large resistance change of substantially the same intensity as that of the Co/Cu artificial superlattice layer at the low magnetic field.

PREFERRED EMBODIMENTS OF THE INVENTION

The magnetoresistance effect element of the present invention will be explained by making reference to the accompanied drawings.

Figure 1:
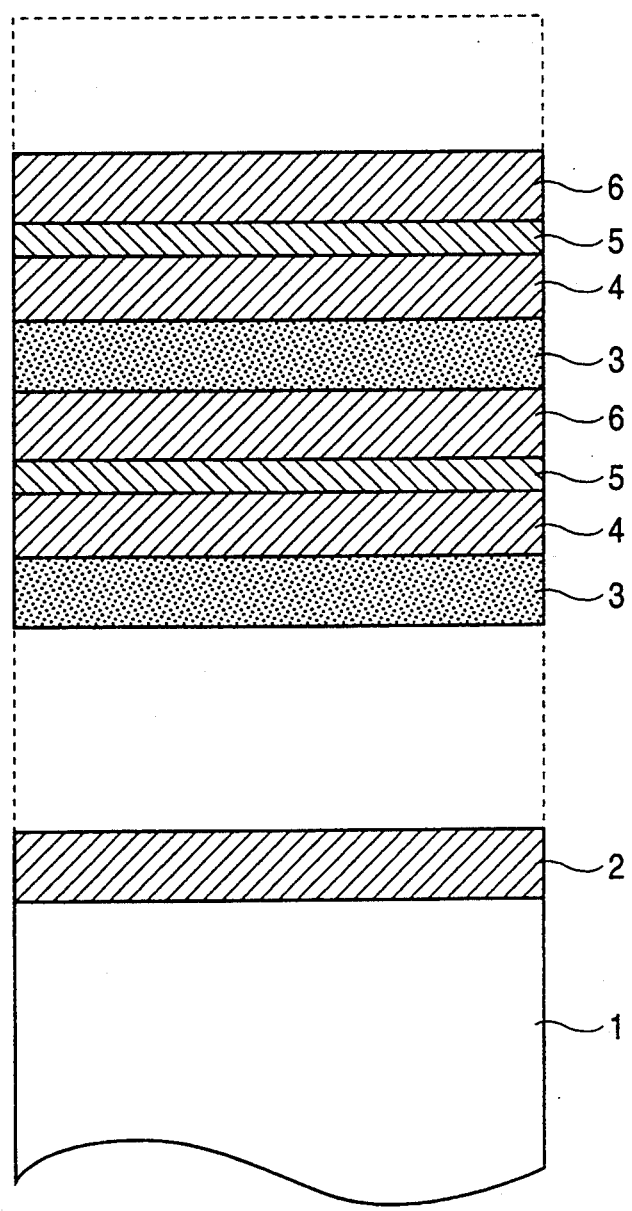
FIG. 1 is a cross-sectional view of one example of the magnetoresistance effect element according to the present invention, FIG. 2(A)

FIG. 1 shows a cross section of one example of the artificial superlattice of the magnetoresistance effect element according to the present invention.

In FIG. 1, the artificial superlattice may be formed directly on a substrate 1, while it is preferably formed on a buffer layer 2 which is formed on the substrate, since the $\Delta R/R$ is further increased.

As a substrate, a plate or layer of glass, silicon, MgO, GaAs, ferrite or a polymer (e.g. polyethylene terephthalate, polyethylene naphthalate, polyimide, polyamide, etc.) and the like can be used.

The buffer layer 2 is formed before the formation of the artificial superlattice to improve surface smoothness of the substrate or crystalline orientation of the artificial superlattice. Usually, the buffer layer is formed from a metal such as iron, chromium, tungsten, titanium, vanadium, manganese and an alloy thereof.

A thickness of the buffer layer 2 is not critical. Usually it is at least 2 nm in view of the improvement of the properties, and preferably not larger than 100 nm in view of the productivity.

The artificial superlattice constituting the magnetoresistance effect element of the present invention has the structure that the nonmagnetic layer 3, the first magnetic layer 4, the second magnetic layer 5 and the third magnetic layer 6 are laminated in this order at least twice.

Both the first magnetic layer 4 and the third magnetic layer 6 are formed from a material comprising cobalt as a main component, and each has a thickness of at least 0.2 nm, preferably at least 0.4 nm. When either one of the first and third magnetic layers is thinner than 0.2 nm, the interfaces of the first and third magnetic layers and the nonmagnetic layers are changed, so that $\Delta R/R$ may be decreased. Preferably the thickness of each of the first and third magnetic layers is not larger than 5 nm in view of the productivity. The thicknesses of the first and third magnetic layers may be the same or different.

The second magnetic layer 5 is formed from a material comprising iron, nickel or their alloy as a main component. Its thickness is at least 0.01 nm, preferably at least 0.05 nm. The upper limit of the thickness is preferably 5 nm in view of productivity. In the present invention, the thickness of the second magnetic layer does not exceed half of the total thickness of the first and third magnetic layers. When the thickness of the second magnetic layer exceeds half of the total thickness of the first and third magnetic layers, $\Delta R/R$ decreases.

Preferred examples of the nonmagnetic material forming the nonmagnetic layer 3 are Cu, Ag, Au, Ru, Pt, Al, Mg, Mo, Zn, Nb, Ta, V, Hf, Sb, Zr, Ga, Ti, Sn, Pb or their alloys. Among them, Cu, Ag, Au and Ru are more preferred. A thickness of the nonmagnetic layer is at least 0.5 nm, and preferably not larger than 5 nm in view of productivity.

The thickness of each of the buffer layer, the magnetic layers and the nonmagnetic layer can be measured by a step difference meter, X-ray diffraction, transmission electron microscope, scanning electron microscope, Auger electron spectroscopy and the like.

The sequence of the lamination in the artificial superlattice consists of the nonmagnetic layer 3, the magnetic layers 4, 5 and 6 and again the layers 3, 4, 5 and 6, - - - in this order. But, the lamination may be started from any of the layers 3, 4, 5 and 6, and terminated by any of the layers 3, 4, 5 and 6, insofar as the above sequence of the layers is formed.

The number of the laminations is at least two sets of the four layers 3, 4, 5 and 6. The maximum number of laminations is preferably about 100 in view of productivity.

The layer or layer may be formed by vapor deposition, sputtering, molecular beam epitaxy (MBE) and the like.

EXAMPLES

The present invention will be illustrate by the following Examples more in detail.

Example 1

A glass plate was used as a substrate 1 and placed in a high vacuum deposition apparatus, and the apparatus was evacuated to $10^{-8}$ Torr. or lower. While rotating the substrate which was kept at room temperature for forming a uniform layer, a buffer layer of chromium was formed to a thickness of 5 nm, and then an artificial superlattice having the composition of Table 1 was formed at a rate of 0.03 nm/sec.

The composition of the artificial superlattice comprising the magnetic layers and the nonmagnetic layer, its $\Delta R/R$ and the intensity of external magnetic field at which the resistance was maximum $H(R_{max})$ are shown in Table 1.

In Table 1, when the composition is expressed, for example, $[Co(0.5)/Fe(0.2)/Co(0.5)/Cu(3)] \times 8$, it means that a Co layer of 0.5 nm in thickness, an Fe layer of 0.2 nm in thickness, a Co layer of 0.5 nm in thickness and a Cu layer of 3 nm in thickness were successively deposited and the deposition of the four layers was repeated eight times.

TABLE 1

| Example No. | Structure of artificial superlattice | $\Delta R/R$ (%) | H ($R_{max}$) (Oe) |
| --- | --- | --- | --- |
| 1 | $[Co(0.5)/Fe(0.2)/Co(0.5)/Cu(3)] \times 8$ | 9.0 | 80 |
| Co. Ex. 1 | $[Co(1)/Cu(3)] \times 8$ | 9.2 | 190 |
| Co. Ex. 2 | $[Fe(0.2)/Co(1)/Fe(0.2)/Cu(3)] \times 8$ | 2.1 | 30 |

The magnetization was measured by a vibrating sample magnetometer (VSM). The dimension of the sample for MR measurement, which had the structure shown in Table 1, was 1×10 mm. While applying external magnetic field in plane, perpendicularly to the current direction, the resistance was measured by a four point probe method by changing the external field from −500 to 500 Oe, and the magnetoresistance ratio $\Delta R/R$ was calculated from the measured resistances. The magnetoresistance ratio $\Delta R/R$ was calculated according to the following equation:

$$\Delta R/R = \frac{R_{max} - R_{min}}{R_{min}} \times 100(\%)$$

wherein $R_{max}$ is the maximum resistance and $R_{min}$ is the minimum resistance.

Figure 2A:
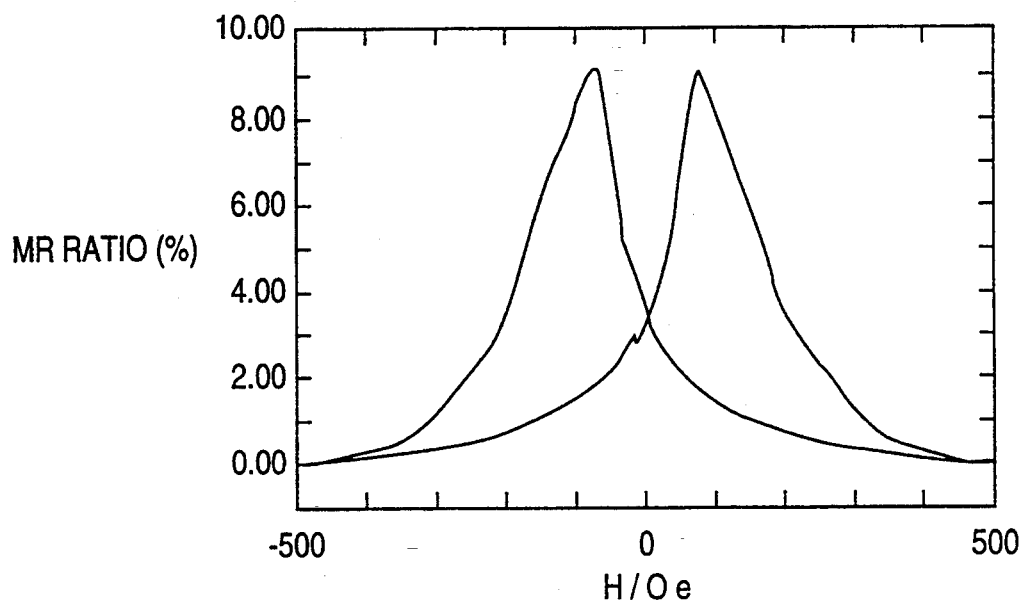
FIG. 2B shows the MR curve and the magnetization curve of the artificial superlattice disclosed in Example 1, FIG. 3(A)
Figure 2B:
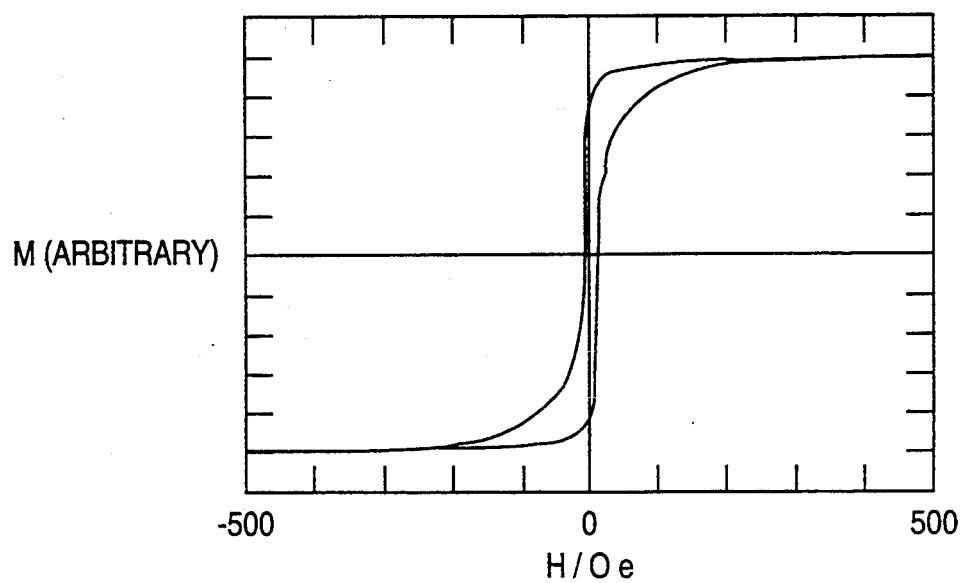
Figure 3A:
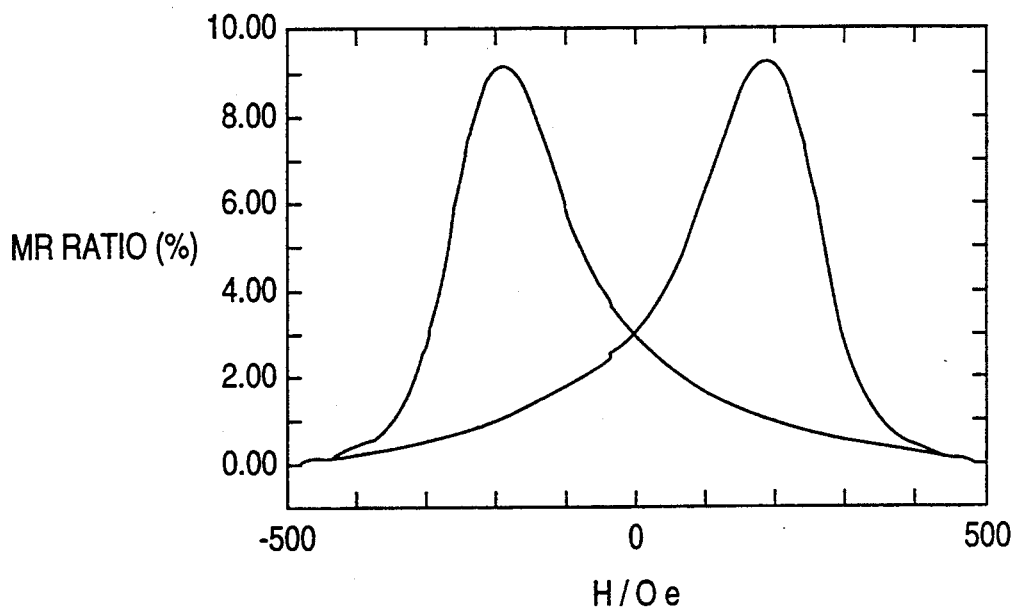
FIG. 3(B) shows the MR curve and the magnetization curve of the artificial superlattice disclosed in Comparative Example 1, and FIG. 4(A)
Figure 3B:
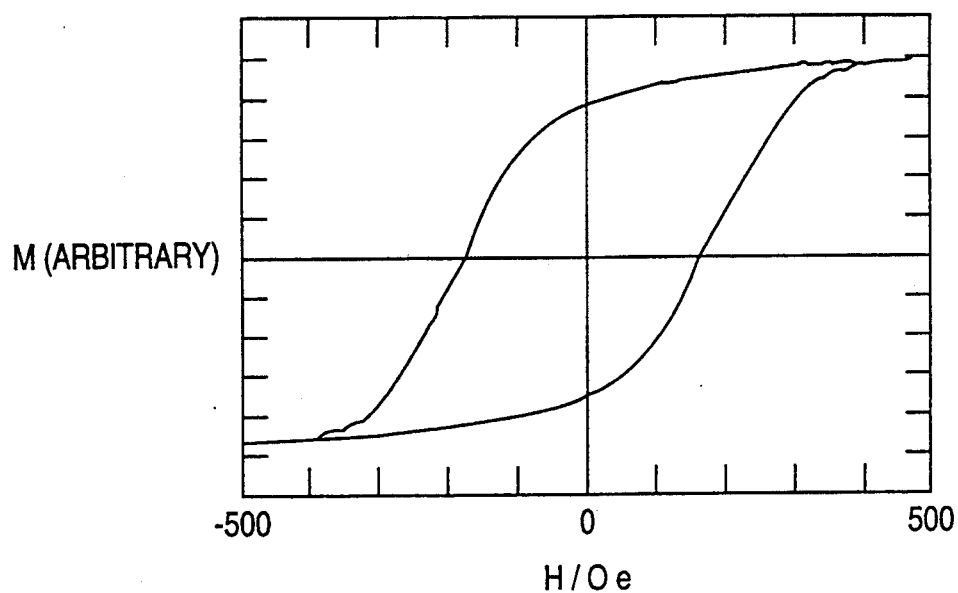
Figure 4A:
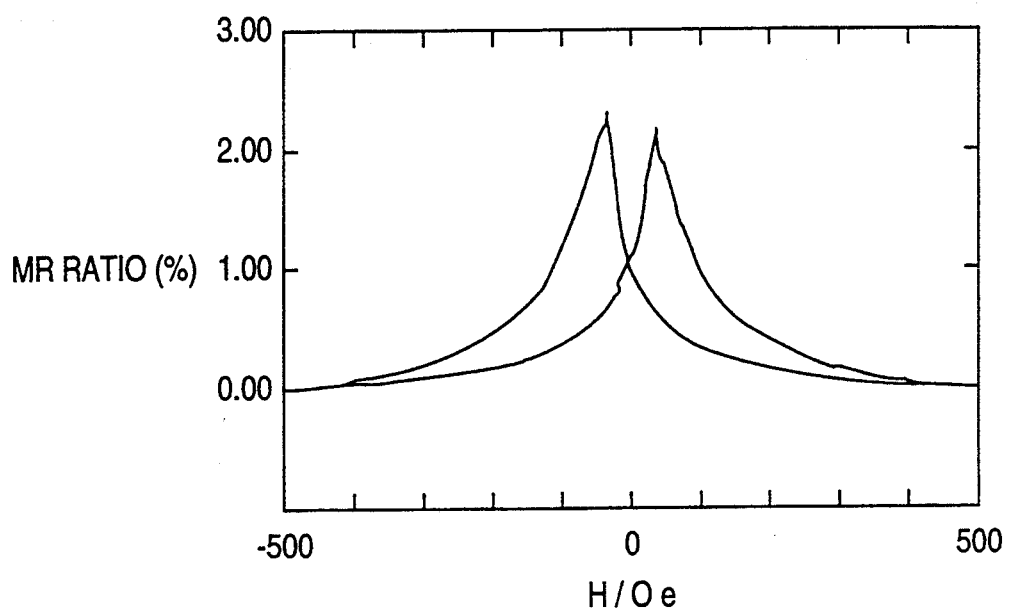
FIG. 4(B) shows the MR curve and the magnetization curve of the artificial superlattice disclosed in Comparative Example 2.
Figure 4B:
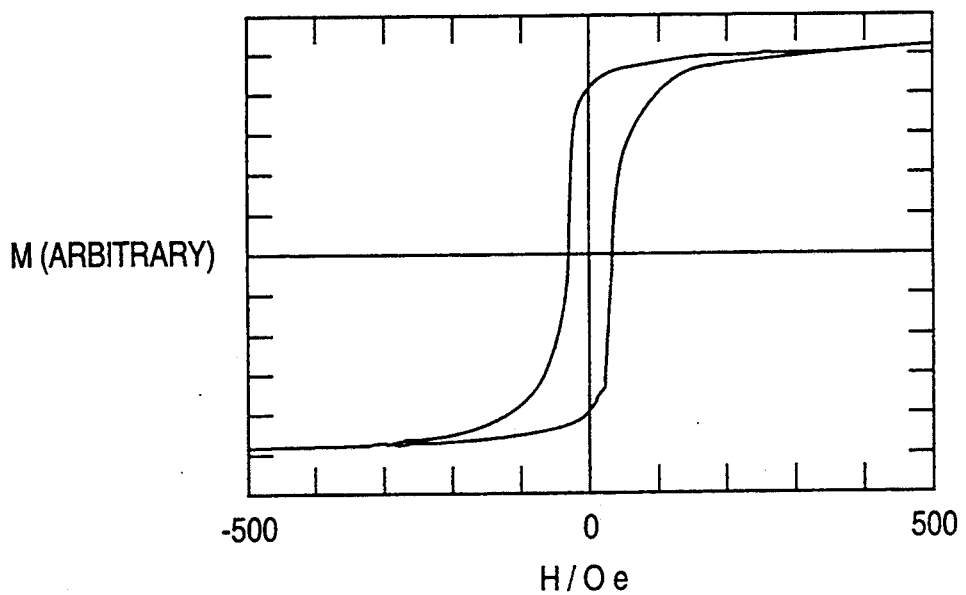

The MR curves and the magnetization curves obtained in Example 1, and Comparative Examples 1 and 2 are shown in FIGS. 2(A) and (B), 3(A) and B and 4(A) and (B), respectively.

Comparative Example 1 is one of the conventional examples, and $H(R_{max})$ was large. In Comparative Example 2, the iron layer was formed between the magnetic layer and the nonmagnetic layer. In this case, $\Delta R/R$ was greatly decreased.

From the curves shown in FIGS. 2(A) and (B), 3(A) and (B) and 4(A) and (B) and the results described in Table 1, it is seen that the artificial superlattice layer of the present invention exhibits a large magnetic resistance change in a low magnetic field.

Examples 2 to 5

In the same manner as in Example 1 except that the thicknesses of the magnetic layers were changed as shown in Table 2, the artificial superlattice was formed.

The results are shown in Table 2.

TABLE 2

| Example No. | Composition of artificial superlattice | ΔR/R (%) | H (R$_{max}$) (Oe) |
| --- | --- | --- | --- |
| 2 | [Co(0.4)/Fe(0.05)/Co(0.4)/Cu(3)] × 8 | 9.5 | 100 |
| 3 | [Co(0.4)/Fe(0.1)/Co(0.4)/Cu(3)] × 8 | 9.2 | 90 |
| 4 | [Co(0.4)/Fe(0.4)/Co(0.4)/Cu(3)] × 8 | 8.8 | 70 |
| Co. Ex. 3 | [Co(0.4)/Fe(0.6)/Co(0.4)/Cu(3)] × 8 | 3.2 | 40 |
| 5 | [Co(0.3)/Fe(0.2)/Co(0.5)/Cu(3)] × 8 | 8.8 | 80 |
| Co. Ex. 4 | [Co(0.1)/Fe(0.2)/Co(0.7)/Cu(3)] × 8 | 1.6 | 50 |

From the results of Table 2 and Comparative Example 1 in Table 1, it is seen that when the thickness of the second magnetic layer is at least 0.05 nm, H(R$_{max}$) can be made small. In addition, it is seen that when the thickness of the second magnetic layer is not larger than half of the total thickness of the first and third magnetic layers, the artificial superlattice having large ΔR/R can be produced, while the former exceeds the latter, ΔR/R greatly decreases.

The thicknesses of the first and third magnetic layers are not necessarily the same as shown in Example 5. Each thickness of the first and third magnetic layers is at least 0.2 nm, preferably at least 0.4 nm.

Examples 6 and 7

In the same manner as in Example 1 except that the material of the second magnetic layer was selected as shown in Table 3, the artificial superlattice was formed.

The result are shown in Table 3.

TABLE 3

| Ex. No. | Composition of artificial superlattice | ΔR/R (%) | H(R$_{max}$) (Oe) |
| --- | --- | --- | --- |
| 6 | [Co(0.5)/Ni(0.2)/Co(0.5)/Cu(3)] × 8 | 9.0 | 110 |
| 7 | [Co(0.5)/Ni$_{0.8}$Fe$_{0.2}$(0.2)/Co(0.5)/Cu(3)] × 8 | 8.8 | 80 |
| C. 5 | [Co(0.5)/Cr(0.2)/Co(0.5)/Cu(3)] × 8 | 1.2 | 20 |

As seen from the results of Table 3, the large ΔR/R can be also obtained at the low magnetic field, when the second magnetic layer is formed from nickel or a nickel/iron alloy instead of iron.

What is claimed is:

1. A magnetoresistance effect element comprising a substrate on which a first magnetic layer having a thickness of 0.2 to 5 nm which comprises cobalt, a second magnetic layer having a thickness of between 0.01 nm and 5 nm which comprises iron or nickel or an alloy thereof, a third magnetic layer having a thickness of 0.2 to 5 nm which comprises cobalt and a nonmagnetic layer having a thickness of 0.5 to 5 nm are laminated in this order at least twice, wherein a thickness of said second magnetic layer is not larger than half of the total thickness of said first and third magnetic layers.

2. The magnetoresistance effect element according to claim 1, wherein said nonmagnetic layer comprises at least one metal selected from the group consisting of Cu, Ag, Au and Ru.

3. The magnetoresistance effect element according to claim 1, wherein the thickness of each of said first and third magnetic layers is at least 0.4 nm.

4. The magnetoresistance effect element according to claim 1, which further comprises a buffer layer between said substrate and the laminated layers.

5. The magnetoresistance effect element according to claim 4, wherein said buffer layer has a thickness of between 2 nm and 100 nm.

* * * * *

UNITED STATES PATENT AND TRADEMARK OFFICE
CERTIFICATE OF CORRECTION

PATENT NO. : 5,432,661
DATED : July 11, 1995
INVENTOR(S) : Teruya SHINJO et al.

It is certified that error appears in the above-indentified patent and that said Letters Patent is hereby corrected as shown below:

On the cover page, please correct the Assignee data [73] by adding a second assignee: NEC Corporation, Tokyo, Japan Signed and Sealed this Twelfth Day of March, 1996

Attest:

BRUCE LEHMAN

*Attesting Officer*   *Commissioner of Patents and Trademarks*